US006388470B1

(12) United States Patent
Mattos et al.

(10) Patent No.: US 6,388,470 B1
(45) Date of Patent: May 14, 2002

(54) HIGH VOLTAGE CMOS SIGNAL DRIVER WITH MINIMUM POWER DISSIPATION

(75) Inventors: Derwin W. Mattos, San Jose; Brian M. Appold, Fremont, both of CA (US)

(73) Assignee: Philips Electronics North American Corporation, New York, NY (US)

( * ) Notice: Subject to any disclaimer, the term of this patent is extended or adjusted under 35 U.S.C. 154(b) by 0 days.

(21) Appl. No.: 09/539,289

(22) Filed: Mar. 30, 2000

(51) Int. Cl.[7] ............................................. H03K 19/0185
(52) U.S. Cl. ............................. 326/81; 326/83; 326/68; 326/57
(58) Field of Search ........................... 326/83, 86, 80, 326/81, 63, 68, 70, 71, 57, 58

(56) References Cited

U.S. PATENT DOCUMENTS

| 5,465,054 A |   | 11/1995 | Erhart ........................... 326/34 |
| 5,528,190 A |   | 6/1996  | Honnigford ................... 327/328 |
| 5,635,861 A | * | 6/1997  | Chan et al. .................... 326/81 |
| 5,736,887 A | * | 4/1998  | Spence ......................... 326/81 |
| 5,815,354 A |   | 9/1998  | Braceras et al. .............. 361/56 |
| 5,914,617 A | * | 6/1999  | Barlett ......................... 326/81 |
| 5,986,472 A |   | 11/1999 | Hinedi et al. ................. 326/68 |
| 6,028,450 A | * | 2/2000  | Nance .......................... 326/81 |
| 6,031,394 A | * | 2/2000  | Cranford, Jr. et al. ........ 326/81 |

* cited by examiner

Primary Examiner—Michael Tokar
Assistant Examiner—Don Phu Le
(74) Attorney, Agent, or Firm—Wagner, Murabito & Hao LLP

(57) ABSTRACT

The system and method facilitates the transmission of relatively high voltage signals via a thin oxide gate CMOS device without an excessively detrimental electric field build up across the thin oxide layers forming a gate in a CMOS device. The high voltage CMOS thin oxide gate system and method provides a degradation repression bias voltage signal to the thin oxide gate of the CMOS device. The degradation repression bias voltage signal establishes a differential voltage potential between the source and drain components of the thin oxide gate output CMOS device and the gate component of the thin oxide gate output CMOS device. The degradation repression bias voltage signal is maintained at a level that prevents that excessively detrimental electric field stresses are not induced in oxide layers that form the thin oxide gate in the output CMOS device. The System and method does not require additional power supplies or reference voltages and does not cause the thin gate oxide device to dissipate additional power in a static (non-switching) state.

13 Claims, 21 Drawing Sheets

340A

US 6,388,470 B1

HIGH VOLTAGE CMOS SIGNAL DRIVER WITH MINIMUM POWER DISSIPATION

The present invention relates to the field of integrated circuit design and semiconductor chip fabrication. More particularly, the present invention relates to a voltage sensitive thin gate oxide complementary symmetry metal-oxide semiconductor (CMOS) fabricated circuit for transmitting high voltage signals.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results attempt to include integrated circuit technology and transmit relatively high voltage signals.

Typically integrated circuits comprise a large quantity of electrical components or devices on a single small semiconductor chip. An important advantage of integrated circuits is their compact size. Utilizing modern integrated circuit fabrication techniques, the size of individual electrical devices (e.g., transistors) is constantly being reduced. However, as the size of the devices is reduced the devices become more sensitive. The materials used to form electrical devices in an integrated circuit have intrinsic characteristics that limit their performance capabilities such as conductivity capacity and ability to withstand electric field stresses. The ability of a component comprising a particular material to perform certain electrical functions is significantly impacted by the quantity of material included in the device. For example, as the three dimensional size of the device as a whole is scaled down, thinner gate oxide thickness on a CMOS device is required to maintain active performance levels. However, excessive electric field stresses have particularly detrimental affects on gates formed with relatively thin oxide layers.

FIG. 1 is an illustration of a P-type output CMOS device 100 exposed to high voltage electric field stress conditions while in an on state. P-type CMOS device 100 includes gate 110, drain 120, source 130, substrate 140 and conduction channel 150. Drain 120 and source 130 include positively doped material. Bulk 160 and substrate 140 include negatively doped material. Gate 110 is at a potential of zero volts. Drain 120, source 130 and bulk 160 are at relatively high voltage potentials of Vhv. The differential voltage potential from gate 100 to drain 120 and source 130 cause electric field stresses on oxide layers forming gate 110. For example as the voltage Vhv potential of drain 120 and source 130 increases relative to the 0V potential of gate 110, the resulting electric fields cause the oxide layers forming gate 110 to deteriorate. This degradation has adverse impacts on the operations and longevity of the device.

Typically integrated circuits include input/output (I/O) buffer components that control input and output transmissions of electrical signals to exterior devices. Some applications require output electrical signals to be transmitted at relatively high voltages. The ability of a device to operate properly and with reasonable longevity while transmitting relatively high voltage electrical signals is largely determined by tolerances defined by the type of material included in the device and the thickness of the material. In some situations devices with thick gate oxide layers are capable of transmitting relatively high voltage signals but do not offer the cost advantages of relatively thin gate oxide devices. However, utilizing thin gate oxide devices to transmit relatively high voltage signals often results in electric fields that apply detrimental stresses to the device, and these detrimental stresses usually impede the performance and longevity of the device.

What is required is an integrated circuit system and method that includes relatively thin gate oxide devices capable of transmitting electrical signals at relatively high voltage levels without an excessively detrimental electric field build up across oxide layers forming a gate in the device. The thin gate oxide devices should operate without exacerbated longevity degradation due to excessive electrical field stresses across thin oxide gate layers. It should require no additional power supplies and should not cause the thin gate oxide device to dissipate addition al power in a static (non-switching) state.

SUMMARY OF THE INVENTION

The present invention is an integrated circuit system and method that includes relatively thin gate oxide CMOS devices capable of transmitting electrical signals at relatively high voltage levels without an excessively detrimental electric field build up across oxide layers forming a gate in the device. The system and method of the present invention facilitates the operations of thin gate oxide devices without exacerbated longevity degradation due to excessive electrical field stresses across thin oxide gate layers. The present invention does not require additional power supplies or reference voltages and does not dissipate additional power in a static (non-switching) state.

In one embodiment of the present invention, a degradation repression bias voltage component applies a degradation repression bias voltage signal to a gate of a high voltage output thin oxide gate CMOS device. The degradation repression bias voltage is set within a range that maintains a voltage differential from the gate of the output CMOS device to the source and the drain of the -output CMOS device such that the voltage differential does not cause excessive electrical field stresses on the gate. For example, in one embodiment of the present invention, a degradation repression bias voltage component utilizes a bias voltage range limiter to confine the voltage of a CMOS gate signal within an acceptable range. While a signal is propagating through the circuit a degradation repression bias voltage driver is utilized to actively drive and tightly hold the degradation repression bias voltage signal. After the signal has propagated through the circuit, the degradation repression bias voltage driver is de-activated.

DETAILED DESCRIPTION OF THE INVENTION

Reference will now be made in detail to the preferred embodiments of the invention, a system and method for implementing a high voltage CMOS thin oxide gate signal driver, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Figure 1:
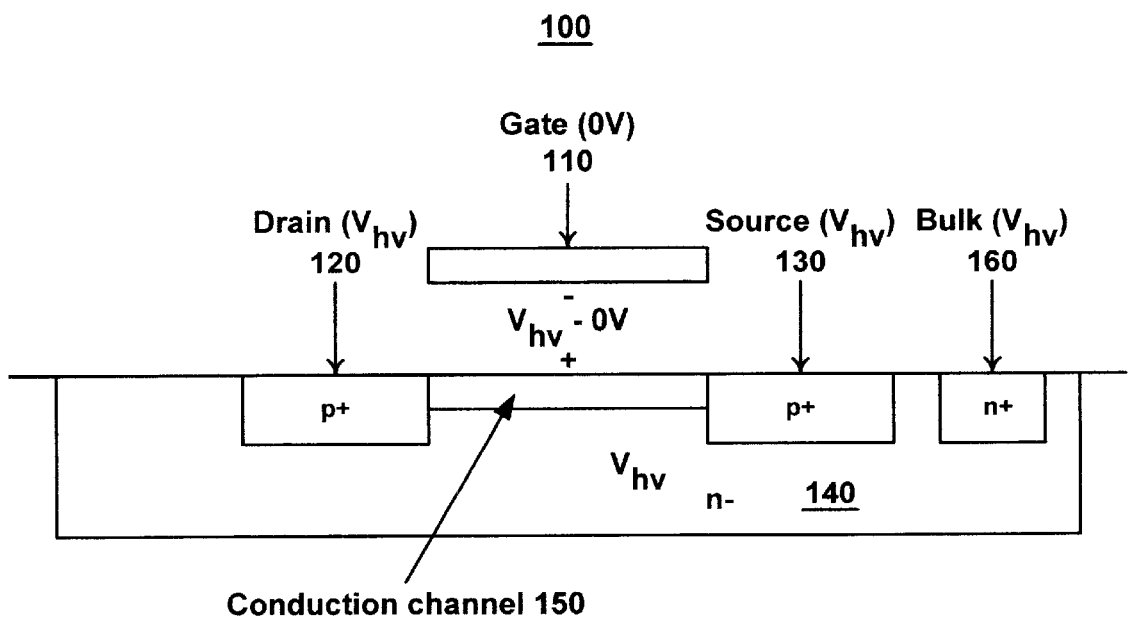
FIG. 1 is an illustration of a prior art P-type output CMOS device exposed to high voltage electric field stress conditions while in an on state.
Figure 2A:
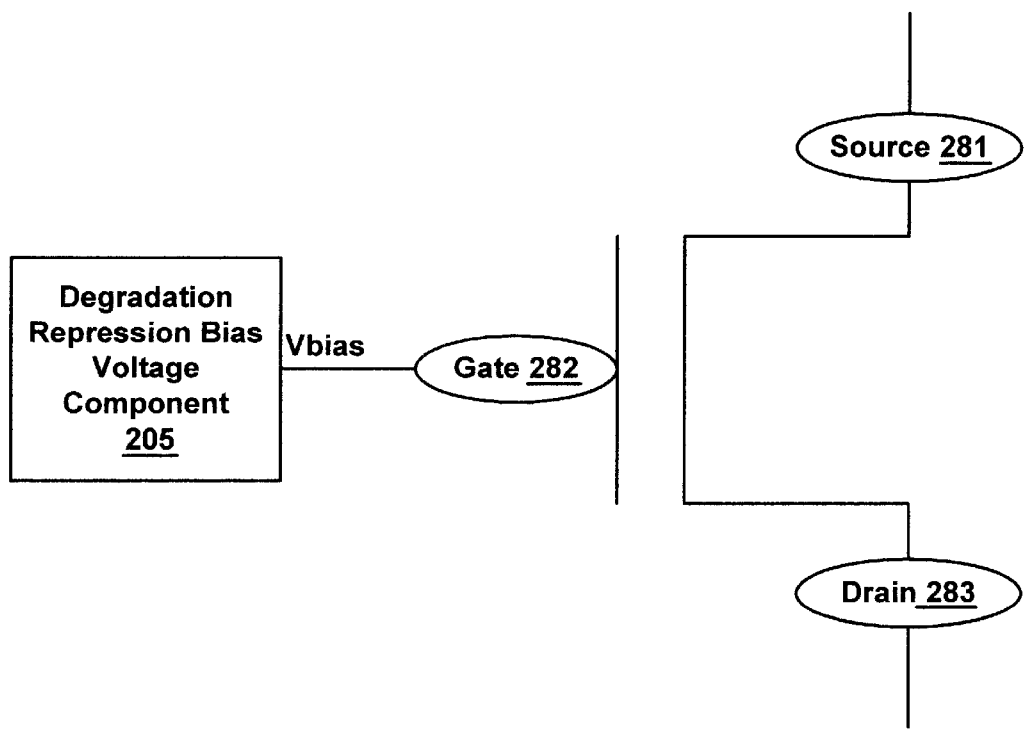
FIG. 2A is a block diagram illustrating a degradation repression bias voltage system, one embodiment of the present invention.

The system and method of the present invention applies a degradation repression bias voltage (Vbias) signal to a gate of a high voltage output thin oxide gate CMOS device. FIG. 2A is a block diagram illustrating a degradation repression bias voltage system 200A that includes degradation repression bias voltage component 205, one embodiment of the present invention. Degradation repression bias voltage component 205 is coupled to gate 282 which is coupled to source 281 and drain 283. Degradation repression bias voltage component 205 supplies a degradation repression bias voltage (Vbias) signal to gate 282. The degradation repression bias voltage (Vbias) maintains a voltage differential from the gate of the output CMOS device to the source and the drain of the output CMOS device such that the voltage differential does not cause excessive electrical field stresses on the gate. Thus, the voltage differentials from gate 282 to source 281 (Vgs) and from gate 282 to drain 283 (Vgd) do not exceed acceptable electric field tolerance limitations of oxide layers included in gate 282 even though a voltage differential between source 281 and drain 283 is relatively high (e.g., higher than traditional limitations of gate oxide stress voltage limits).

Figure 2B:
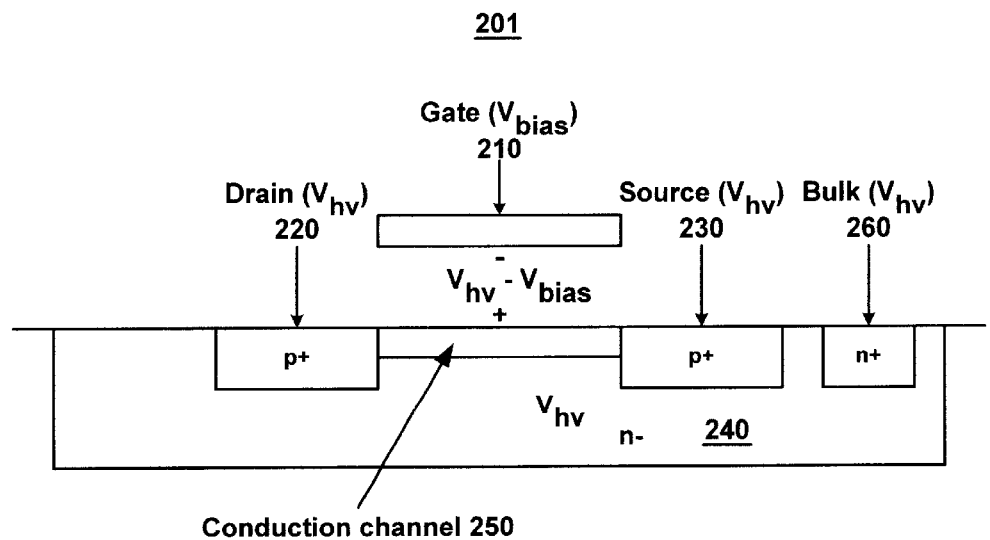
FIG. 2B is an illustration of a P-type output CMOS device of the present invention.
Figure 2B:
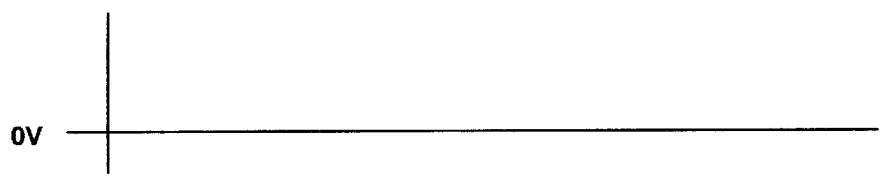

FIG. 2B is an illustration of a P-type output CMOS device 201 of the present invention. P-type output CMOS device 201 includes gate 210, drain 220, source 230, substrate 240 and conduction channel 250. Drain 220 and source 230 include positively doped material. Bulk 260 and substrate 240 include negatively doped material. Drain 220 and source 230 are at relatively high voltage potentials of Vhv. Gate 210 is at a degradation repression bias voltage of Vbias, where Vbias is held within the limits of a desired range that is predetermined based upon the intrinsic electrical characteristics and limitations of P-type output CMOS device 201. The limits of the desired Vbias range are selected to create a differential voltage potential from gate 210 to drain 220 and source 230 that does not cause electric field stresses on oxide layers forming gate 210 or cause the gate to turn off unintentionally.

Figure 2C:
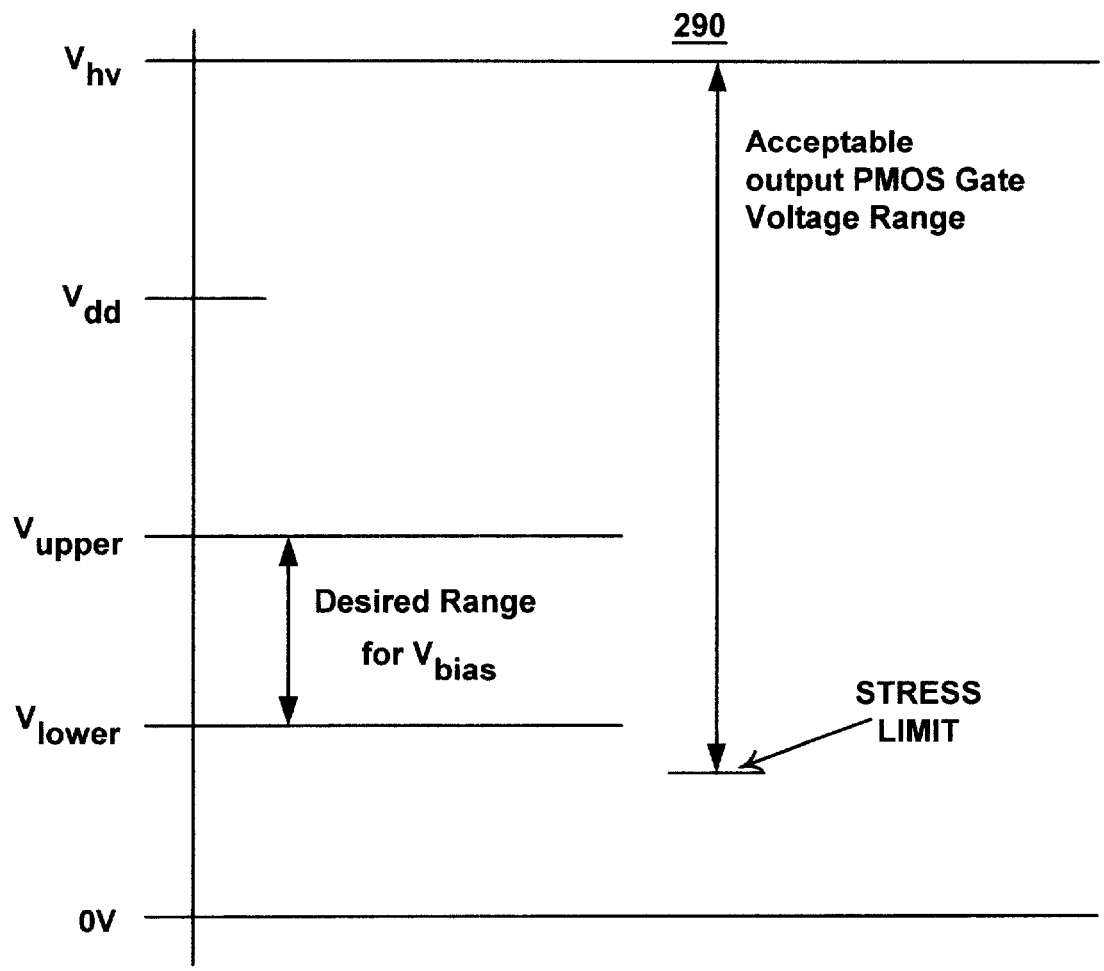
FIG. 2C is one example of a process tolerant Vbias range chart of the present invention that illustrates the relationship between the desired Vbias range for a P-type output CMOS device and other voltages applied to the P-type output CMOS device.

FIG. 2C is one example of a process tolerant Vbias range chart 290 of the present invention that illustrates the relationship between the desired Vbias range for P-type output CMOS device 201 and other voltages applied to P-type output CMOS device 201. The values of Vbias range limits Vlower and Vupper are determined by a number of factors. Vlower is set at a value that prevents the voltage differential between Vhv and Vlower from exceeding acceptable electrical stress tolerance limitations of output CMOS device 201. In one embodiment of the present invention, Vupper is established low enough to prevent the voltage potential at the gate from getting close enough to the voltage level of a source to cause a thin oxide gate CMOS device to inadvertently turn off.

In one embodiment of the present invention Vlower is determined by subtracting a tolerance voltage from an output voltage. For example, one embodiment of P-type output CMOS device 201 has a maximum tolerance voltage of 3.63 volts and an output requirement of 3.9 volts. As long as the voltage differential from gate 210 to drain 220 and source 230 is kept equal to or below 3.63 volts (the same level as the tolerance voltage) there will not be excessive electrical stresses on the thin metal oxide layers forming gate 110. Thus, Vlower for one embodiment of P-type output CMOS device 201 is 0.27 volts (3.9 output requirement voltage minus 3.63 tolerance voltage) or higher and since Vbias is equal to or above Vlower, P-type output CMOS device 201 is able to transmit output signals at a relatively high voltage without incurring excessive electrical field stresses on metal oxide layers forming gate 210.

Figure 2D:
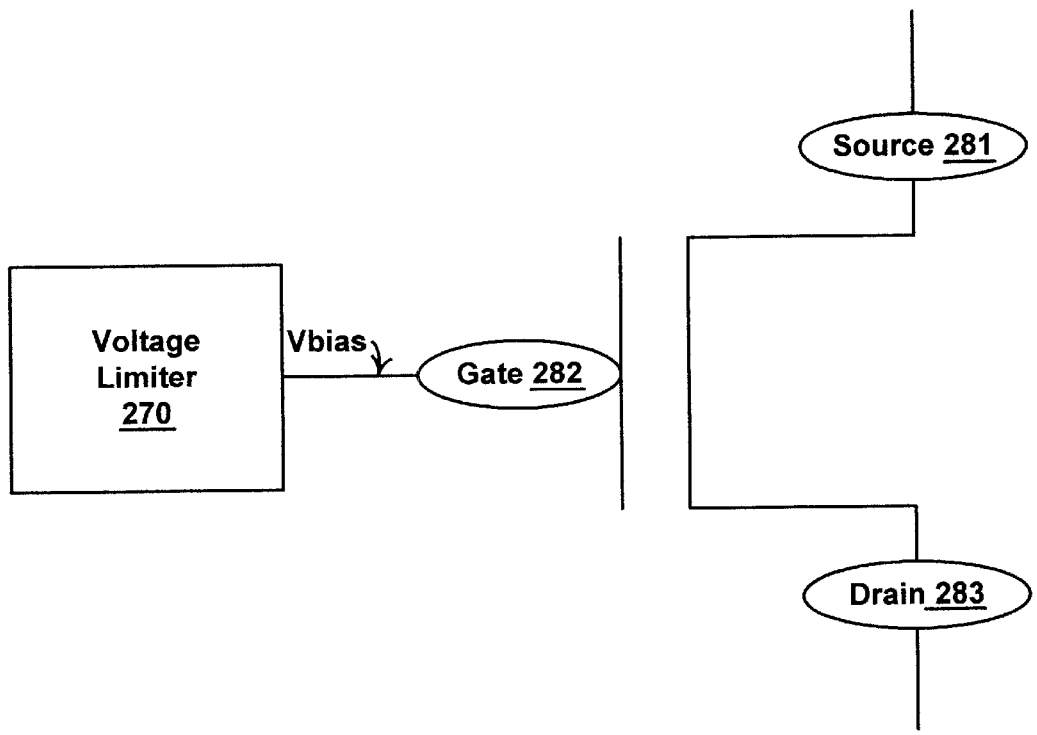
FIG. 2D is a block diagram illustrating a bias voltage range limiter, one embodiment of degradation repression bias voltage component.
Figure 2E:
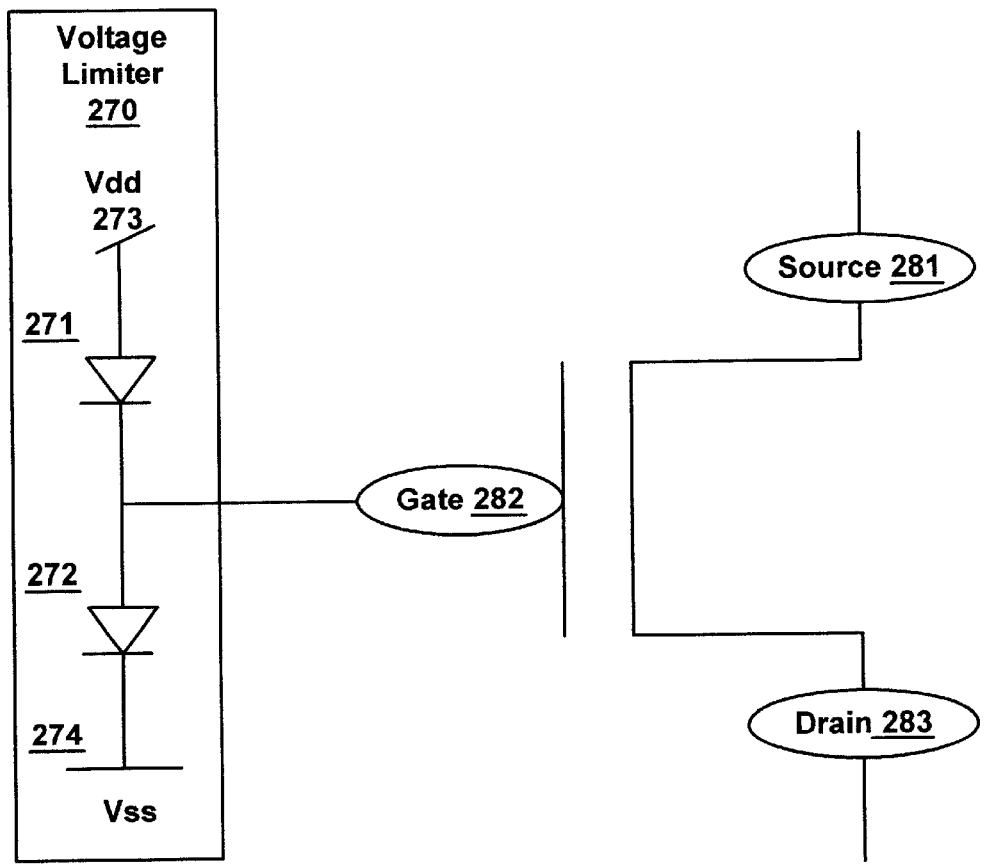
FIG. 2E is an illustration of one embodiment of a bias voltage range limiter in which the bias voltage range limiter includes diodes.

FIG. 2D is a block diagram illustrating bias voltage range limiter 270, one embodiment of degradation repression bias voltage component 205. Bias voltage range limiter 270 is coupled to gate 282 which is coupled to source 281 and drain 283. Bias voltage range limiter 270 maintains a Vbias signal between a Vupper and Vlower value. FIG. 2E is an illustration of one embodiment of bias voltage range limiter 270. In this embodiment bias voltage range limiter 270 includes diode 271 and diode 272. Diode 271 is coupled to Diode 272 and the Vbias signal. Diode 271 controls the lower limit voltage level (Vlower) of the Vbias signal and Diode 272 controls the upper limit voltage level (Vupper) of the Vbias signal. Vlower and Vupper are set at levels such that current is not induced to flow between Vdd reference point 273 and Vss reference points 274 and there is no power dissipation. Thus, when a gate 282 is turned "on" and a relatively high voltage (Vhv) signal is driven from source 281 to drain 283, electrical stresses on gate 281 are maintained at an acceptable level by the Vbias signal (not zero volts in this example). In one example, gate 282 is turned "off" by setting gate 282 to the same voltage level as Vhv.

Figure 3:
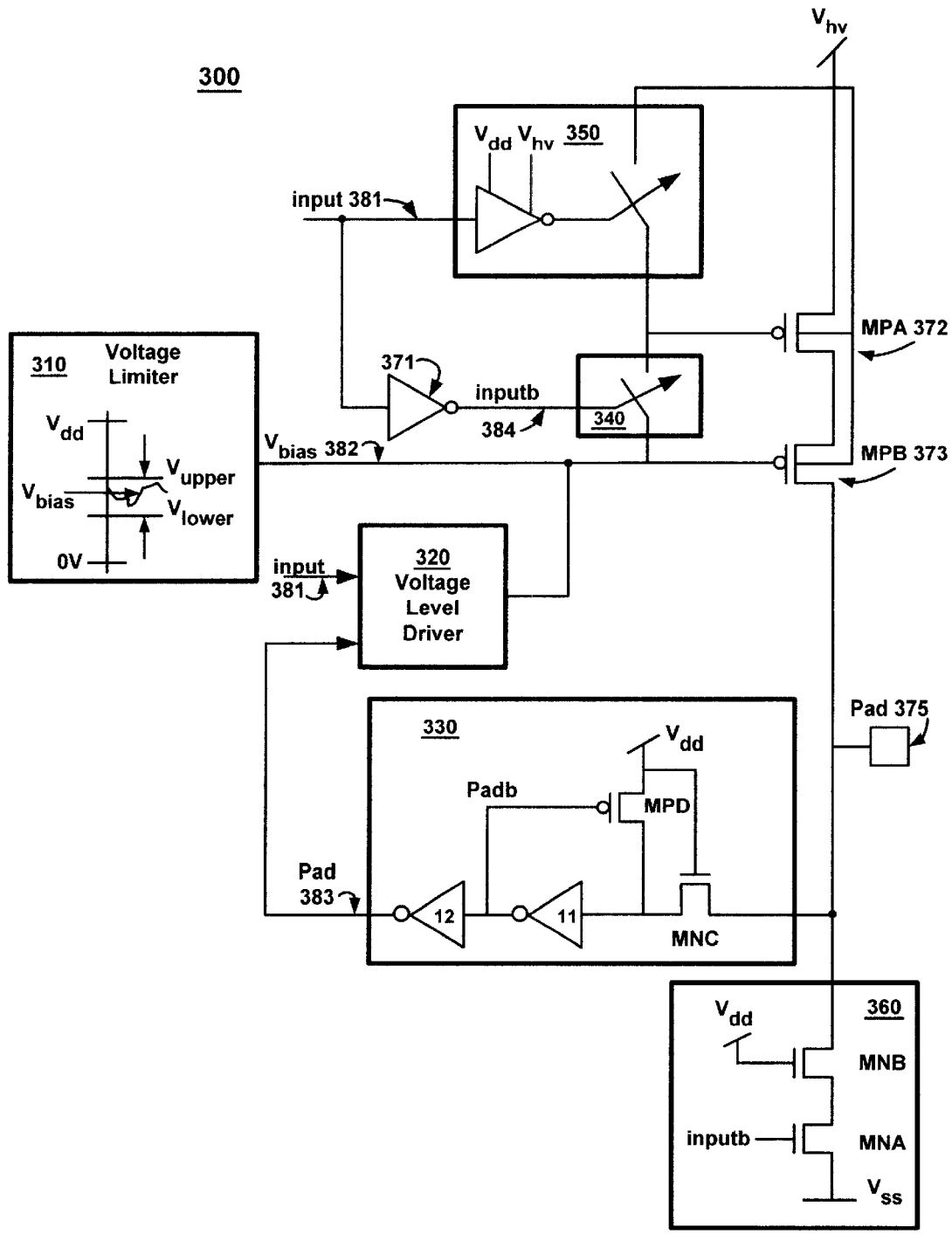
FIG. 3 is an illustration of one embodiment of a high voltage CMOS thin oxide gate signal driver system of the present invention.

FIG. 3 is an illustration of high voltage CMOS thin oxide gate signal driver system 300, one embodiment of the present invention. High voltage CMOS thin oxide gate signal driver system 300 comprises bias voltage range limiter 310, bias voltage level driver 320, high voltage input component 330, on state component 340, off state component 350, pulldown component 360, inverter 371, CMOS device (MPA) 372, CMOS device (MPB) 373, and pad 375. Bias voltage range limiter 310 is coupled to bias voltage level driver 320, on state component 340, and CMOS device (MPB) 373. Bias voltage level driver 320 is coupled to high voltage input component 330, on state component 340, and CMOS device (MPB) 373. High voltage input component 330 is coupled to bias voltage level driver 320, pulldown component 360, CMOS device (MPA) 372, CMOS device (MPB) 373, and pad 375. Off state component 350 is coupled to inverter 371, CMOS device (MPB) 373, and on state component 340 which is also coupled to CMOS device (MPB) 373. High voltage input component 330, pulldown component 360, pad 375, CMOS device (MPB) 373, are all coupled to one another. CMOS device (MPA) 372 is coupled to CMOS device (MPB) 373.

The components of high voltage CMOS thin oxide gate signal driver system 300 operate together to provide a relatively high voltage output without significant detrimental impacts on the oxide layers forming gates included in CMOS device (MPA) 372 and CMOS device (MPB) 373. Bias voltage range limiter 310 prevents a Vbias signal voltage deviation from a predetermined gate degradation bias voltage range. Bias voltage level driver 320 actively drive and solidly holds Vbias to a value within the desired gate degradation repression bias voltage range while a signal is passing through high voltage CMOS thin oxide gate signal driver system 300. High voltage input component 330 is an input receiver that provides a feedback signal to bias voltage level driver 320. On state component 340 activates (or turns on) output device CMOS device (MPA) 372. Off state component 350 transmits a signal that drives the gate of CMOS device (MPA) 372 to a relatively high voltage (e.g., Vhv). In one embodiment of the present invention, CMOS device (MPB) 373 is always on and set to Vbias. Pulldown component 360 is used to pull a signal down. Inverter 371 is adapted to ensure said output CMOS device is not receiving a signal to turn on and off at the same time. CMOS device (MPA) 372 and CMOS device (MPB) 373 are output devices (e.g. PMOS transistors) that control the transmission of a relatively high voltage signal (e.g., Vhv). Pad 375 provides a connection point for a high voltage external signal transmission.

Figure 4A:
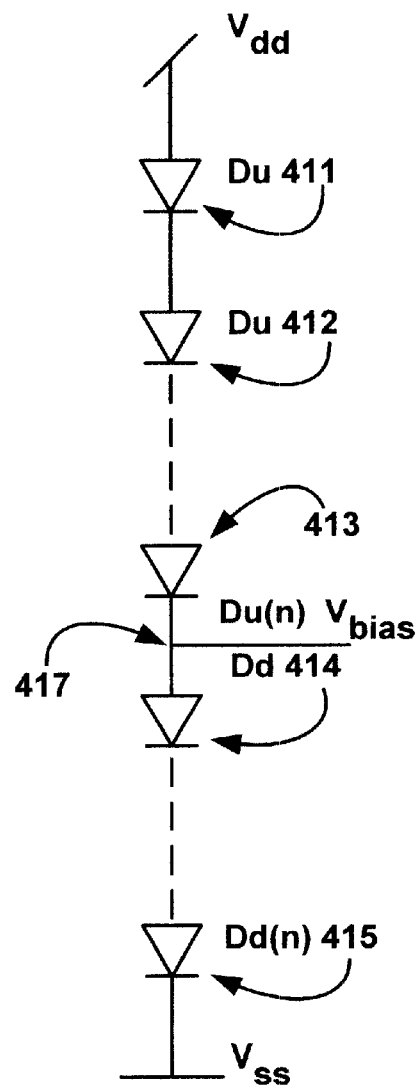
FIG. 4A is a schematic of one embodiment of a bias voltage range limiter of the present invention.

FIG. 4A is an illustration of bias voltage range limiter 310A, one embodiment of bias voltage range limiter 310. Bias voltage range limiter 310A prevents a Vbias signal voltage deviation from a predetermined range in which the Vbias signal is allowed to vary between an acceptable upper limit (Vupper) and acceptable lower limit (Vlower) when signals are not propagating through high voltage CMOS thin oxide gate signal driver system 300. Bias voltage range limiter 310A includes a set of diodes coupled in series and a voltage bias node 317. The set of diodes include Du 411, Du 412 through Du(n) 413, Dd 414 and Dd(n) 415 coupled in series. The voltage differential from one end of the series to the other is Vdd–Vss. Vbias is transmitted or pulled at voltage bias node 317 coupled between diode Du(n) 413 and diode Dd 414. The set of diodes coupled from Vdd to Vbias (e.g., Du 411 to Du(n) 413) serve to confine Vbias from dropping lower than the acceptable lower limit. The diodes coupled from Vss (e.g., 0V) to Vbias (e.g., Dd 414 through Dd(n) 415) confine Vbias from going above the desired upper limit. When Vbias is between Vlower and Vupper, there is relatively small leakage current flow between Vdd and Vss and thus there is virtually no or negligible power dissipation.

Figure 4B:
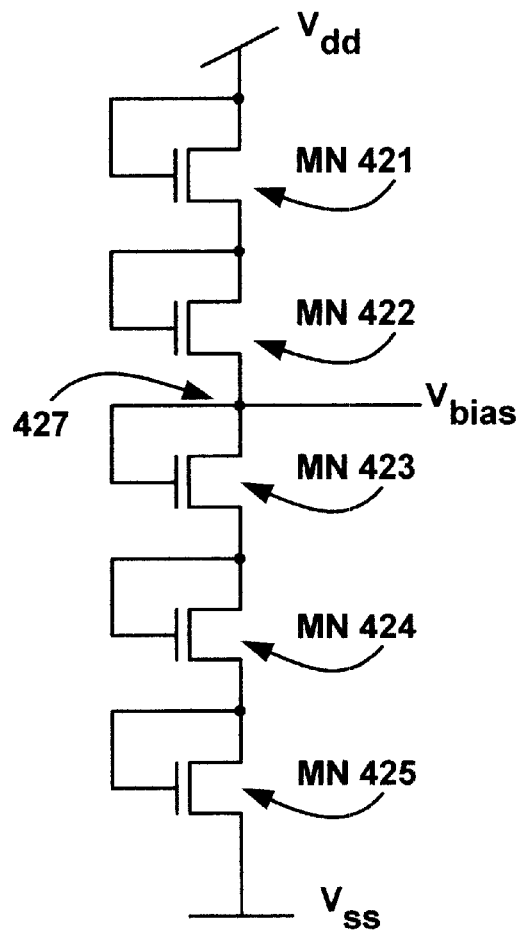
FIG. 4B is a schematic of one embodiment of a bias voltage range limiter of the present invention utilizing NMOS devices.

FIG. 4B illustrates bias voltage range limiter 310B, an embodiment of bias voltage range limiter 310 implemented using NMOS type devices. Bias voltage range limiter 310B includes a set of N type MOS devices and voltage bias node 327. The set of MOS devices include MN 421, MN 422, MN 423, MN 424 and MN 425 coupled in series. The voltage differential from one end of the series to the other is Vdd–Vss. Vbias is pulled at voltage bias node 327 coupled between MOS device MN 422 and MOS device MN 423. Voltage bias node 327 is adapted to transmit a bias voltage (e.g., Vbias).

Figure 4C:
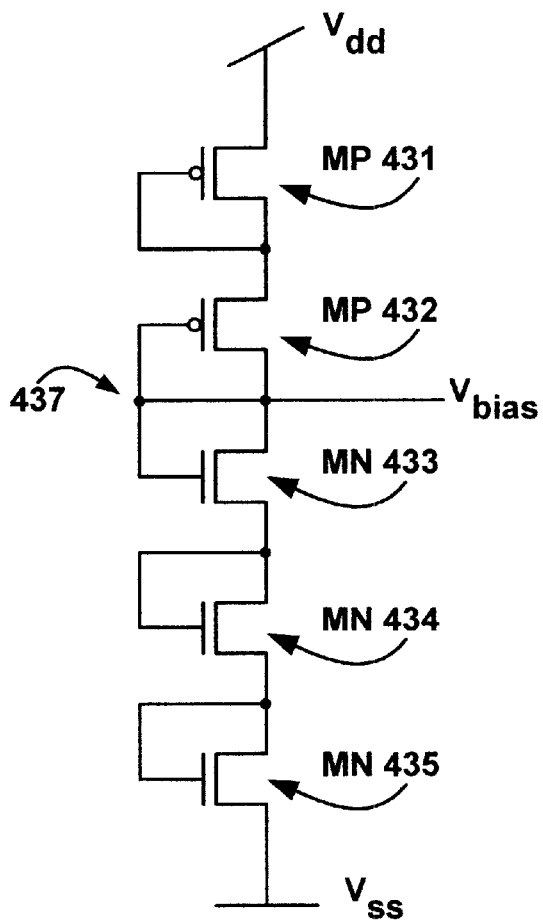
FIG. 4C is a schematic of one embodiment of a bias voltage range limiter of the present invention utilizing PMOS devices.

FIG. 4C shows bias voltage range limiter 310C, an embodiment of bias voltage range limiter 310 comprising PMOS type devices. Bias voltage range limiter 310B includes a set of P type MOS devices, N type MOS devices and voltage bias node 437. The set of MOS devices include MP 431, MP 432, MN 433, MN 434 and MN 435 coupled in series. The voltage differential from one end of the series to the other is Vdd–Vss. Vbias is pulled at voltage bias node 437 coupled between MOS device MP 432 and MOS device MP 433. Voltage bias node 437 transmits the bias voltage (e.g., Vbias). It should be appreciated the present invention can be adapted by one skilled in the art to accommodate other configurations. For example, one embodiment of the present invention includes PMOS devices instead of NMOS devices MN 433, MN 434 and MN 435.

Figure 5A:
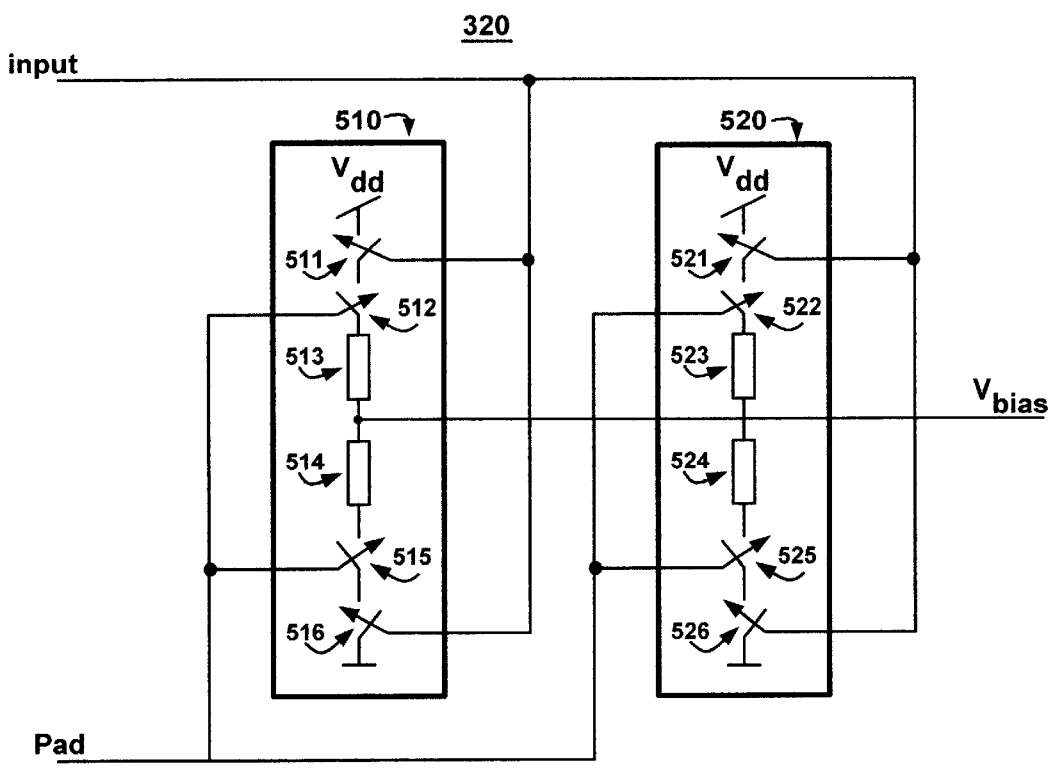
FIG. 5A is an illustration of one embodiment of a bias voltage level driver included in one embodiment of the present invention.

FIG. 5A is an illustration of one embodiment of bias voltage level driver 320. In this embodiment bias voltage level driver 320 includes a first state component 510 and second state component 520. First state component 510 is coupled to second state component 520. First state component 510 includes a first level switch 511, second level switch 512, first level resistor 513, second level resistor 514, third level switch 515, and forth level switch 516. Second level switch 512 is coupled to first level switch 511 and first level resistor 513 which is coupled to second level resistor 514. Third level switch 515 is coupled to second level resistor 514 and forth level switch 516. Second level component 520 includes a seventh level switch 521, eighth level switch 522, third level resistor 523, fourth level resistor 524, ninth level switch 525, and tenth level switch 526. Eighth level switch 522 is coupled to seventh level switch 521 and third level resistor 523 which is coupled to fourth level resistor 524. Ninth level switch 525 is coupled to fourth level resistor 524 and tenth level switch 526.

When a signal propagates through high voltage CMOS thin oxide gate signal driver system 300, bias voltage level driver 320 actively drives the bias voltage Vbias signal and holds it tightly to prevent charge re-distribution effects from taking it out of the desired range. When a signal transition from a logical 0 to a logical 1 Value (e.g., 0 to 1 volt, 0 to 5 volts, etc.) propagates through bias voltage level driver 320, the circuit is set to a first state until the signal transition has passed through the circuit. When a signal transition from a logical 1 to a logical 0 value (e.g., 5 to 0 volts) propagates through bias voltage level driver 320 the circuit is set to a second state until the signal transition has passed through the circuit. Otherwise the circuit remains in a third state in which bias voltage level driver 320 does not actively drive a voltage bias signal. For example, after a signal propagates through high voltage CMOS thin oxide gate signal driver system 300 bias voltage level driver 320 ceases to actively drive Vbias until another transition occurs.

Figure 5B:
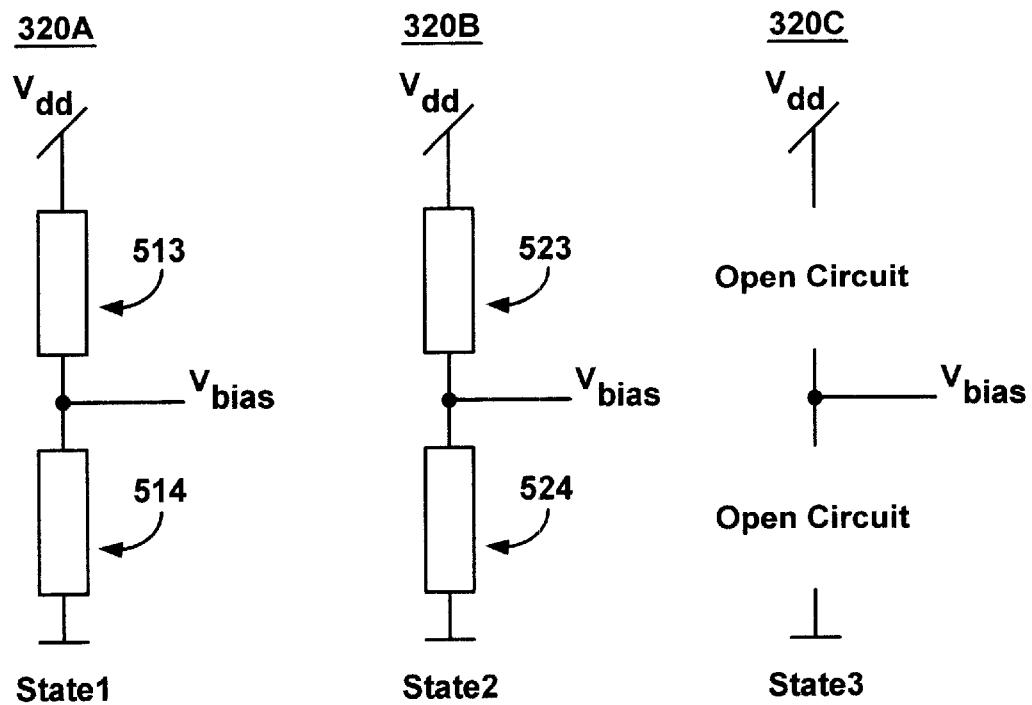
FIG. 5B is a schematic illustration of the states of one embodiment of a bias voltage level driver of the present invention.

FIG. 5B is a schematic illustration of the states of bias voltage level driver 320. The primary differences between the first state 320A and the second state 320B is the values of the resistances of level resistors 513 through 524. The resistances are set so both the first and second state produce the same voltage at Vbias, but the values of first level resistor 513 and second level resistor 514 are much smaller than that of third level resistor 523 and forth level resistor 524. In one example of the present invention, a second state occurs when a signal at a pad requires a very strong Vbias signal to be produced by bias voltage level driver 320. The second state utilizes the active driving of bias voltage level driver 320 to prevent Vbias from extruding below Vlower due to the capacitive coupling characteristics between a gate and drain of a device (e.g., CMOS device (MPB) 373). Thus, the second state will dissipate more power during signal transmission than the first state. In one embodiment of the present invention first level resistor 513 and second level resistor 514 are used for the second state. The differences in resistance values is viable because the second state does not require small resistance values. In the third state 320C an open circuit is created between Vdd and Vbias and between Vbias and Vss. One embodiment of the present invention includes an active drive that prevents Vbias from falling below Vlower due to the capacitive nature of a coupling between a gate and drain of one embodiment of CMOS device (MPB) 373.

Figure 6:
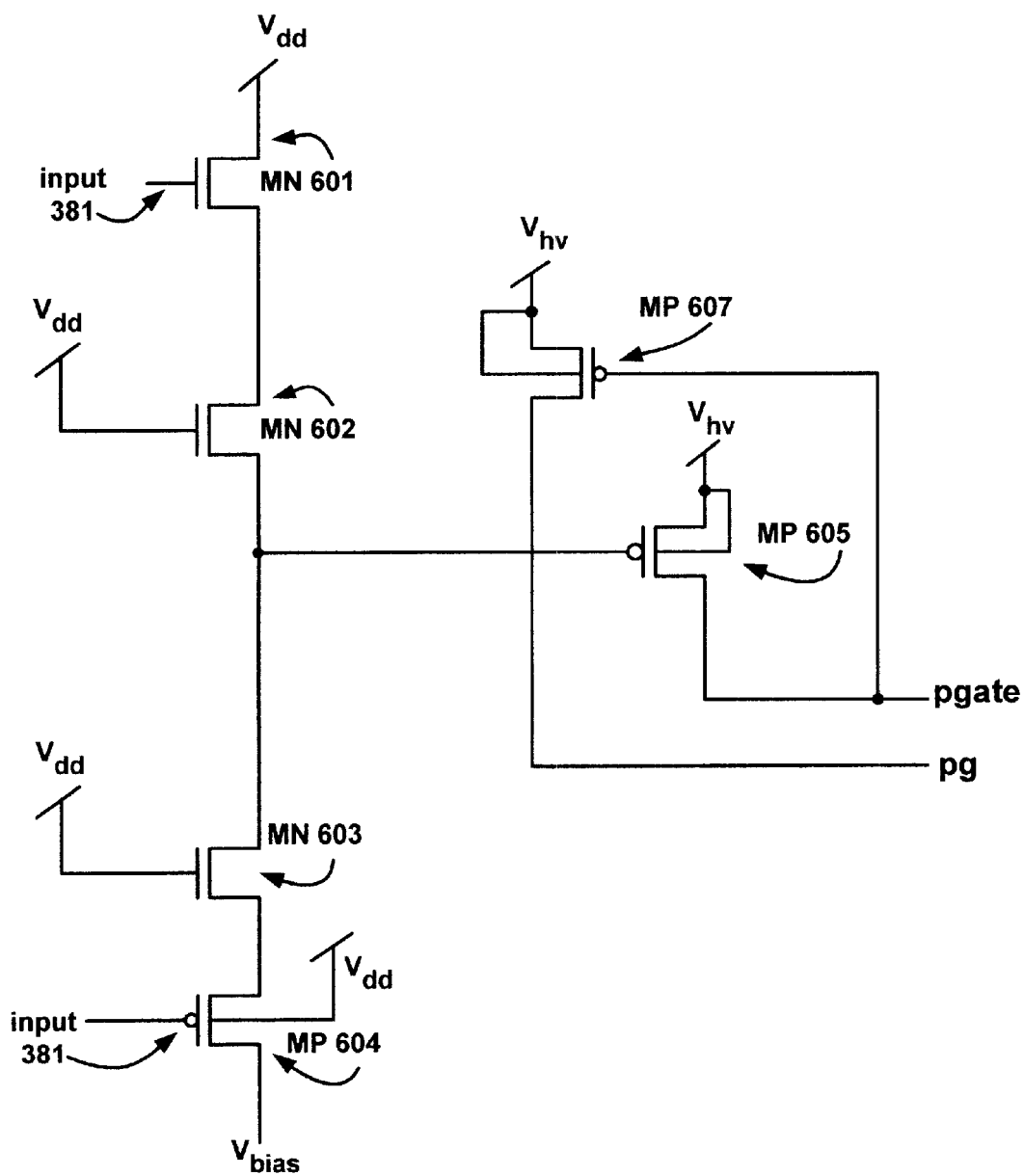
FIG. 6 is a schematic of an off state component of the present invention.

FIG. 6 is a schematic of off state component 350A, one embodiment of off state component 350. Off state component 350A includes NMOS device 601, NMOS device 602, NMOS device 603, PMOS device 604, PMOS device 605 and NMOS device 607. NMOS device 602 is coupled to NMOS device 601, PMOS device 607, PMOS device 605, and NMOS device 603 which is coupled to PMOS device 604. Off state component 350A puts transistor MPA 372 in an "off" state when input signal 381 is at a logic low value. The components of off state component 350A cooperatively operate to turn off the PMOS output device MPA 372 by driving a relatively high voltage (e.g., Vhv) across the gates of PMOS output devices MPA 372.

Figure 7A:
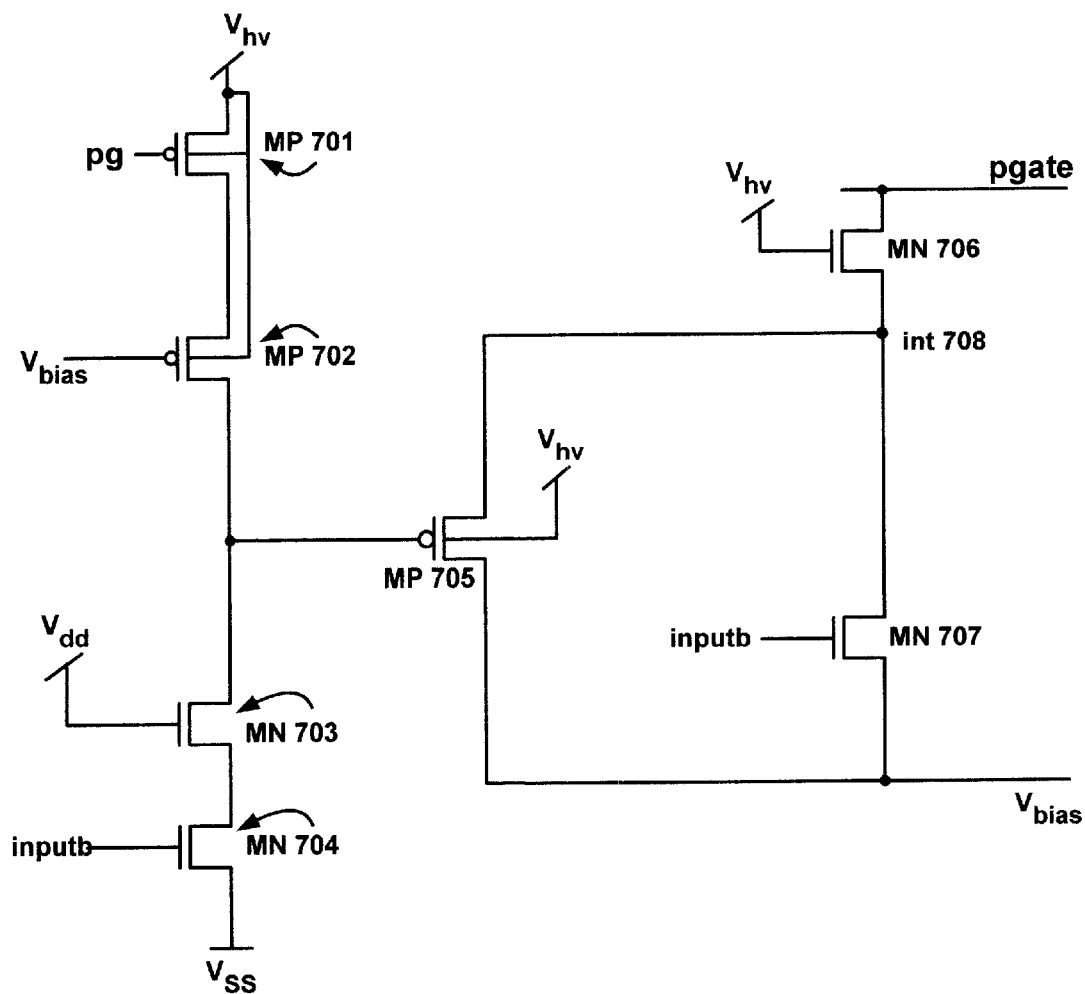
FIG. 7A is a schematic of one embodiment of an on state component of the present invention.

FIG. 7A is a schematic of on state component 340A one embodiment of on state component 340. On state component 340A includes PMOS device 701, PMOS device 702, NMOS device 703, NMOS device 704, PMOS device 705, NMOS device 706, PMOS device 707 and int node 708. PMOS device 702 is coupled to PMOS device 701, PMOS device 705, and NMOS device 703 which is coupled to NMOS device 704. PMOS device 705 is coupled to int node 708 which is coupled to NMOS device 706 and NMOS device 707. On state component 340A is used to put transistor MPA 372 in an "on" state. PMOS device 701 and PMOS device 702 are used to pull gate signal down to Vbias voltage level. To ensure that int node 708 gets pulled down when Vdd is not sufficiently high enough to turn on NMOS device 707, PMOS device 705 is included in the design. PMOS device 701, PMOS device 702, NMOS device 703, and NMOS device 704 are used to control PMOS device 705. The gate of PMOS device 705 is allowed to vary from Vhv to 0V but does not induce overstress on the device (even when its gate voltage is at 0V) due to the manner in which PMOS device 705 is connected.

Figure 7B:
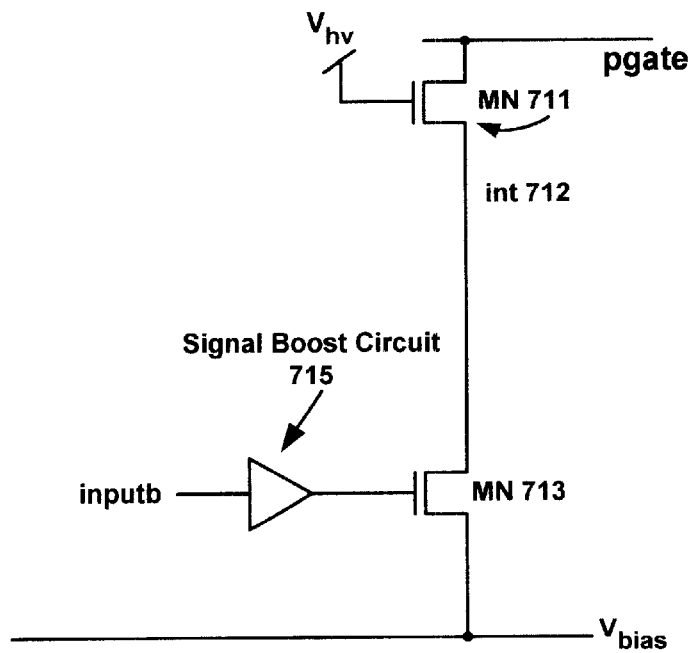
FIG. 7B is a schematic of an alternative embodiment of an on state component of the present invention that includes a signal boost circuit.

FIG. 7B is a schematic of an alternative embodiment of on state component 340B. On state component 340B includes NMOS device 711, int node 712, NMOS device 713, and signal boost circuit 715. Int node 712 is coupled to NMOS device 711 and NMOS device 713 which is coupled to signal boost circuit 715. The booster circuit is also used to drive the gate of NMOS device 712. This ensures that the gate of NMOS device 713 is a high enough voltage to turn the device ON when Vdd minus Vbias is equal to Vgs which may not be sufficient to turn NMOS device 713 on. NMOS device 713 is driven to a level above Vdd.

Figure 7C:
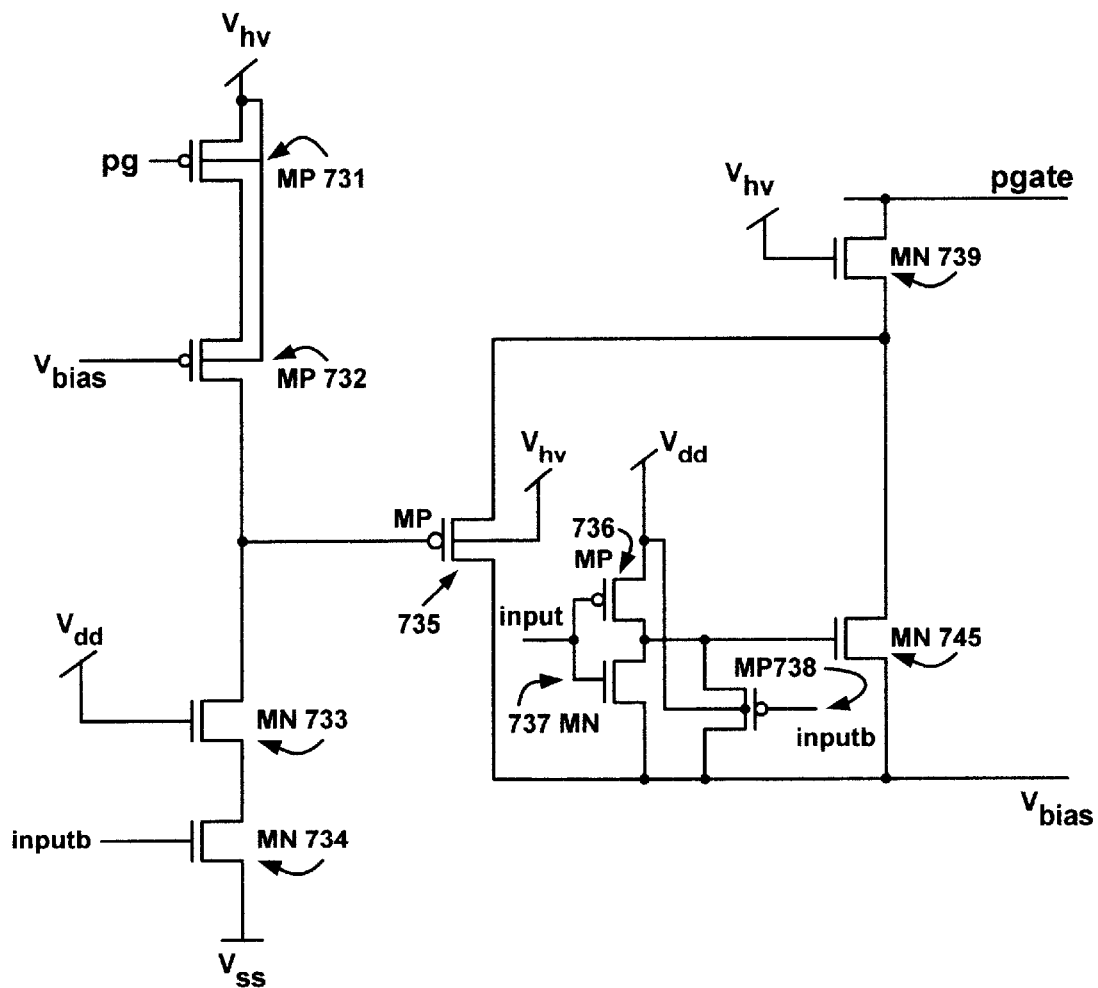
FIG. 7C is a schematic of another alternative embodiment of on state component that does not experience transient overstress condition at the gate-to-drain junction of an NMOS device.

FIG. 7C is a schematic on another alternative embodiment of on state component 340C. On state component 340C includes PMOS device 731, PMOS device 732, NMOS device 733, NMOS device 734, PMOS device 735, NMOS device 739, PMOS device 736, NMOS device 737 and PMOS device 738. PMOS device 732 is coupled to PMOS device 731, PMOS device 735, and NMOS device 733 which is coupled to NMOS device 734. PMOS device 735 is coupled to NMOS device 739 and NMOS device 745. NMOS device 745 is coupled to PMOS device 736, NMOS device 737 and PMOS device 738. On state component 340C includes PMOS device 736, NMOS device 737 and PMOS device 738 to prevent NMOS device 745 from experiencing possible transient overstress conditions from occurring at the gate-to-drain junction of NMOS device 745 when its gate is at a logic low value.

Figure 8:
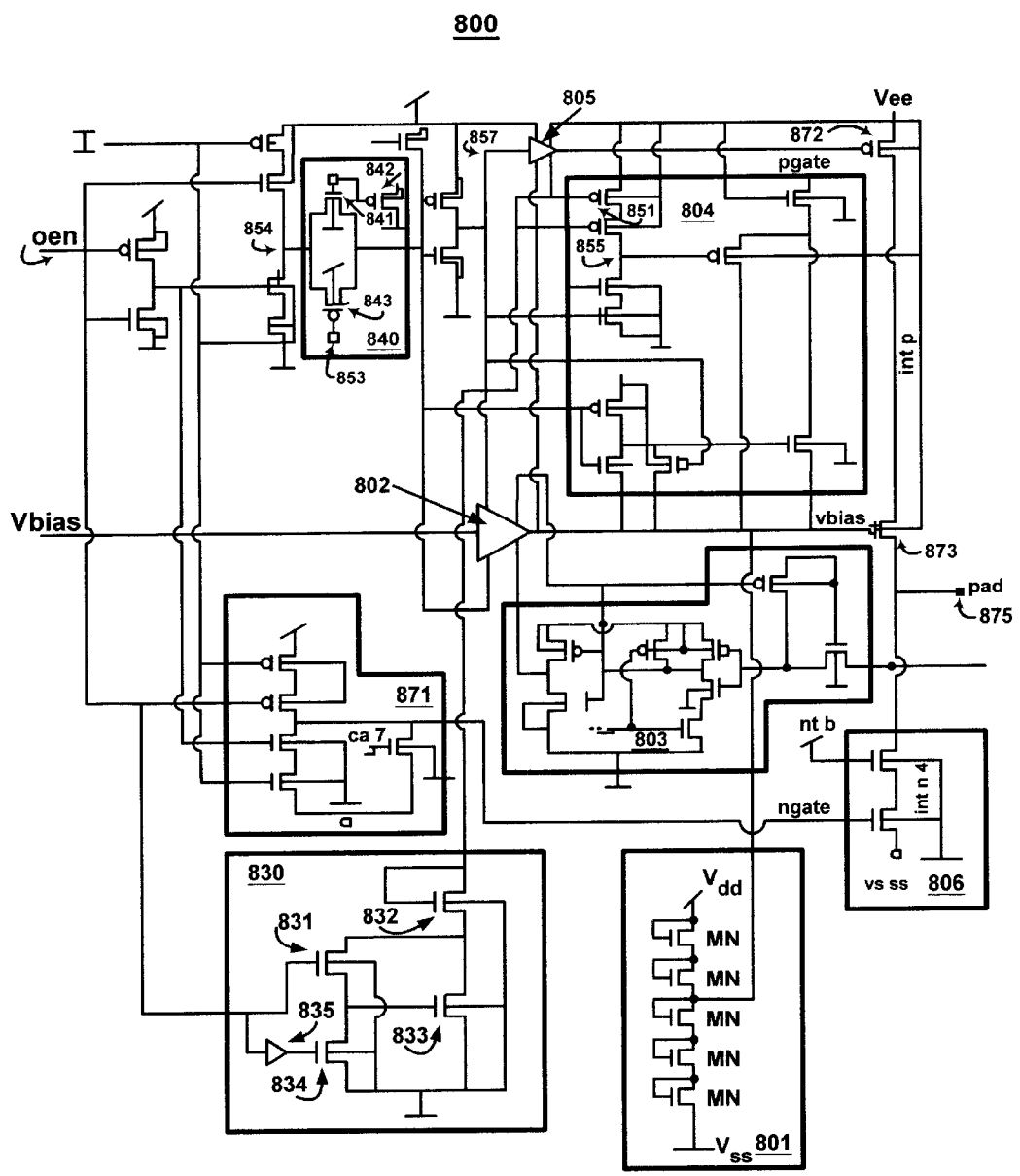
FIG. 8 is a schematic of another embodiment of a high voltage CMOS thin oxide gate signal driver system of the present invention that includes power sequencing capability and an output enable feature.

FIG. 8 is a schematic of high voltage CMOS thin oxide gate signal driver system 800, another embodiment of the present invention that includes power sequencing capability and an output enable feature. High voltage CMOS thin oxide gate signal driver system 800 comprises bias voltage range limiter 801, bias voltage level driver 802, high voltage input component 803, on state component 804, off state component 805, pulldown component 806, inverter 871, PMOS device (MPA) 872, PMOS device (MPA) 873, pad 875, output enable logic component 830 and power sequencing component 840. Limiter 801 is coupled to bias voltage level driver 802 and PMOS device (MPB) 873. Bias voltage level driver 802 is coupled to high voltage input component 803, on state component 804, and PMOS device (MPB) 873, off state component 805 which is coupled to PMOS device (MPA) 872. High voltage input component 830 is coupled to on state component 804. PMOS device (MPA) 872 is coupled to PMOS device (MPA) 873 which is coupled to pad 875 and pulldown component 806. Inverter 871 is coupled to pulldown component 806. Power sequencing component 840 is coupled to off state component 805.

The components of high voltage CMOS thin oxide gate signal driver system 800 operate in a manner similar to high voltage CMOS thin oxide gate signal driver system 300 to provide a relatively high voltage output without significant detrimental impacts on the oxide layers forming gates included in PMOS device (MPA) 872 and PMOS device (MPB) 873. Bias voltage range limiter 801 limits the Vbias voltage to a predetermined gate degradation repression bias voltage range. Bias voltage level driver 802 holds Vbias to a value within a desired gate degradation repression bias voltage range while a signal is passing through high voltage CMOS thin oxide gate signal driver system 800. High voltage input component 803 is an input receiver that provides a feedback signal to bias voltage level driver 802. On state component 804 activates (or turns on) output PMOS device (MPA) 872. Off state component 805 transmits a signal that drives the gate of PMOS device (MPA) 872 to a relatively high voltage (e.g., Vhv). Pulldown component 806 is used to pull a signal down. Inverter 871 ensures the output CMOS device is not receiving a signal to turn on and off at the same time. PMOS device (MPA) 872 and PMOS device (MPA) 873 are output devices (e.g. PMOS transistors) that control the transmission of a relatively high voltage signal (e.g., Vhv). Pad 875 provides a connection point for a high voltage external signal transmission.

In addition to providing similar functions to high voltage CMOS thin oxide gate signal driver system 300, high voltage CMOS thin oxide gate signal driver system 800 includes components that facilitate additional functionality. For example, high voltage CMOS thin oxide gate signal driver system 800 includes power sequencing capability and output enable features. Output enable logic component 830 and power sequencing component 840 prevent current flow from occurring when the power supplies Vhv and Vdd are activated separately. Thus when Vhv is powered up and Vdd remains at 0V for some time, output enable logic component 830 and power sequencing component 840 reduce power dissipation. They also reduce the occurrence of latchup in high voltage CMOS thin oxide gate signal driver system 800.

In one embodiment of the present invention, output enable logic component 830 comprises NMOS devices 831 through 834 and inverter 835. NMOS device 831 is coupled to NMOS devices 832 through 834 and inverter 835 which is also coupled to NMOS device 834. Output enable logic component 830 operates in either a diode mode or off mode. In the off mode output enable logic component 830 does not disable or prevent the high voltage CMOS thin oxide gate signal driver system 800 from performing relatively high voltage output operations. When OEN signal is high, output enable logic component 830 is in diode mode and disables or prevents the high voltage CMOS thin oxide gate signal driver system 800 from performing relatively high voltage output operations. To disable high voltage CMOS thin oxide gate signal driver system 800, a gate signal is driven high and to ensure the gate signal is driven high PMOS gate 851 is pulled low by output enable logic component 830 whenever OEN is high. In this embodiment of high voltage CMOS thin oxide gate signal driver system 800, output enable logic component 830 utilizes a diode configuration to pull PMOS gate 851 low. Thus PMOS gate 851 is not pulled down all the way and low limits of the voltage range are maintained by the diodes of output enable logic component 830.

Power sequencing component 840 sequences control signals to prevent power dissipation when Vee is at zero volts and Vdd is already powered up. In one embodiment of the present invention power sequencing component 840 includes NMOS device 852, PMOS device 842 and PMOS device 843. PMOS device 842 is coupled to PMOS device 841 and 843. If Vee is zero then node 852 is at zero and node 853 is at Vdd (high) resulting in an open circuit condition between node 854 and node 855. Node 855 is pulled up to Vdd and logically known. Thus, node 857 is also logically known without crowbar current flowing through other components such as bias voltage level driver 802, off state component 805 or inverter 371 that is controlled by signals from node 855.

Figure 9:
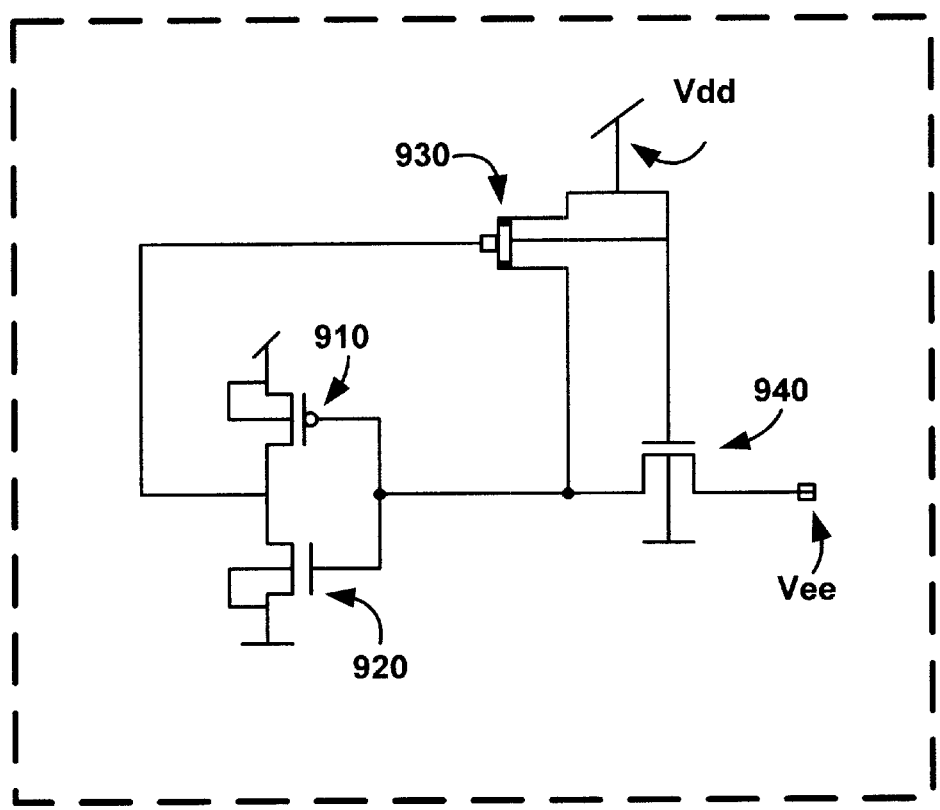
FIG. 9 is a schematic of a low voltage sensor included in one embodiment of the present invention.

One embodiment of power sequencing component 840 includes a Vee low voltage sensor to sense when Vee is less than Vdd. FIG. 9 is a schematic of low voltage sensor 900 one embodiment of the present invention. Low voltage sensor 900 includes PMOS device 910, NMOS device 920, PMOS device 930 and NMOS device 940. PMOS device 910 is coupled to NMOS device 920, PMOS device 930 and NMOS device 940. Vdd is coupled to PMOS device 930 and NMOS device 940 which is coupled to Vee. When low voltage sensor 900 senses that Vee is less than Vdd, high voltage CMOS thin oxide gate signal driver system 800 prevents current flow from Vdd to Vss.

Figure 10:
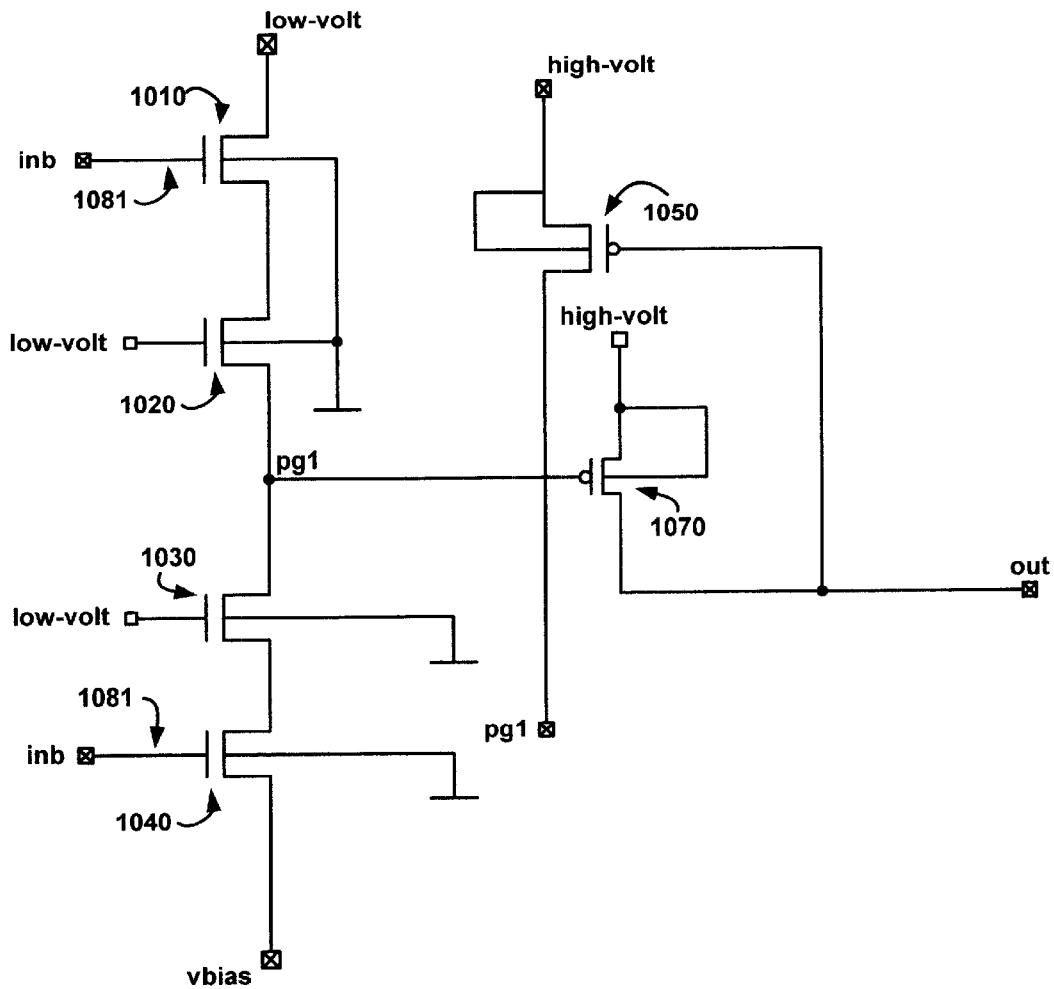
FIG. 10 is a schematic of another embodiment of an off state component of the present invention implemented in a high voltage CMOS thin oxide gate signal driver system that includes enable and disable features.

FIG. 10 is a schematic of one embodiment of off state component 805A, one embodiment of off state component 805. Off state component 805A includes NMOS device 1010, NMOS device 1020, NMOS device 1030, PMOS device 1040, PMOS device 1050 and PMOS device 1070. NMOS device 1020 is coupled to NMOS device 1010, PMOS device 1050, PMOS device 1070 and NMOS device 1030 which is coupled to PMOS device 1040. Off state component 805A puts transistor MPA 872 in an "off" state when input signal 1081 is at a logic low value. The components of off state component 805A cooperatively operate to turn off the PMOS output device MPA 872 by driving a relatively high voltage (e.g., high_volt signal which is at the same voltage level as Vee or Vhv) across the gates of PMOS output devices MPA 872.

Figure 11:
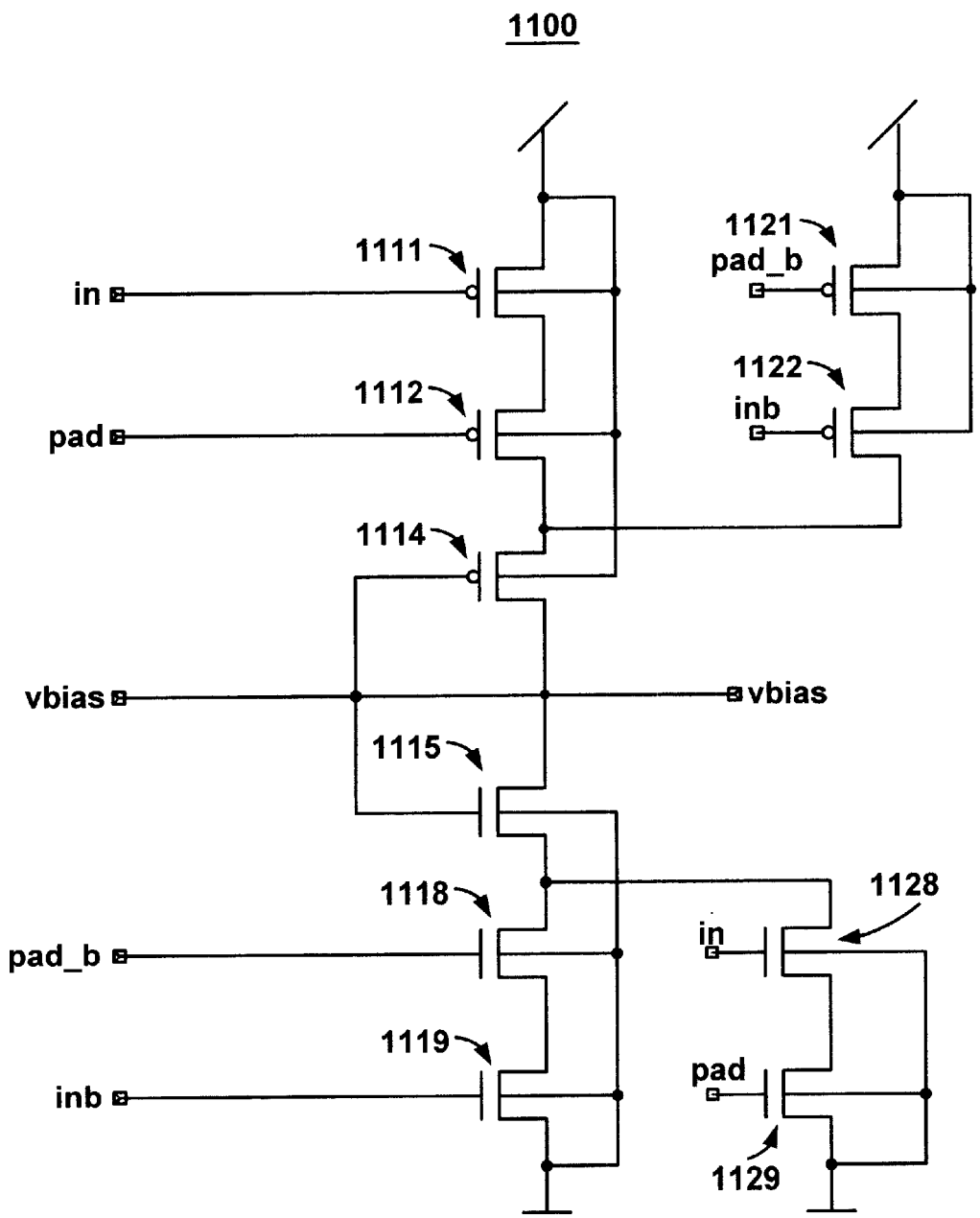
FIG. 11 is a schematic of another embodiment of a bias voltage level driver of the present invention utilizing CMOS devices.

FIG. 11 is a schematic of bias voltage level driver 802A one embodiment of bias voltage level driver 802. Bias voltage level driver 802A includes PMOS devices MP 1111 through 114 and 1121 and 1122 and NMOS devices MN 115 through 119 and 1128 through 1129. PMOS device MP 1112 is coupled to PMOS device MP 1111 and PMOS device MP 1114. PMOS device MP 1122 is coupled to PMOS device MP 1121 and PMOS device MP 1114. NMOS device MN 1118 is coupled to NMOS device MN 1119 and NMOS device MN 1115. NMOS device MN 1128 is coupled to NMOS device MN 1129 and NMOS device MN 1115. PMOS device MP 1114 and NMOS device MN 1115 are coupled to each other and bias voltage signal Vbias.

When a signal propagates through high voltage CMOS thin oxide gate signal driver system 800, bias voltage level driver 802A actively drives the bias voltage Vbias signal and holds it tightly to prevent charge re-distribution effects from taking it out of the desired range. When a signal transitions from a logical 0 to a logical 1 value (e.g., 0 to 5 volts) propagates through bias voltage level driver 802A, the circuit is set to a first state established by PMOS devices MP 1111 and 1112 and NMOS devices MN 1118 and 1119. When a signal transition from a logical 1 to a logical 0 value (e.g., 0 to 5 volts) propagates through bias voltage level, driver 802A the circuit is set to a second state established by PMOS devices MP 1121 and 1122 and NMOS devices MN 1128 and 1129. Otherwise the circuit remains in a third state in which PMOS device MP 1114 and NMOS device MN 115 are open and bias voltage level driver 802A does not actively drive a voltage bias signal. Similar to bias voltage level driver 3202A, in bias voltage level driver 802A the primary differences between the first state and the second state is the values of the resistances established by PMOS devices MP 1111, 1112, 1121 and 1122 and NMOS devices MN 1118, 1119, 1128 and 1129.

Figure 12:
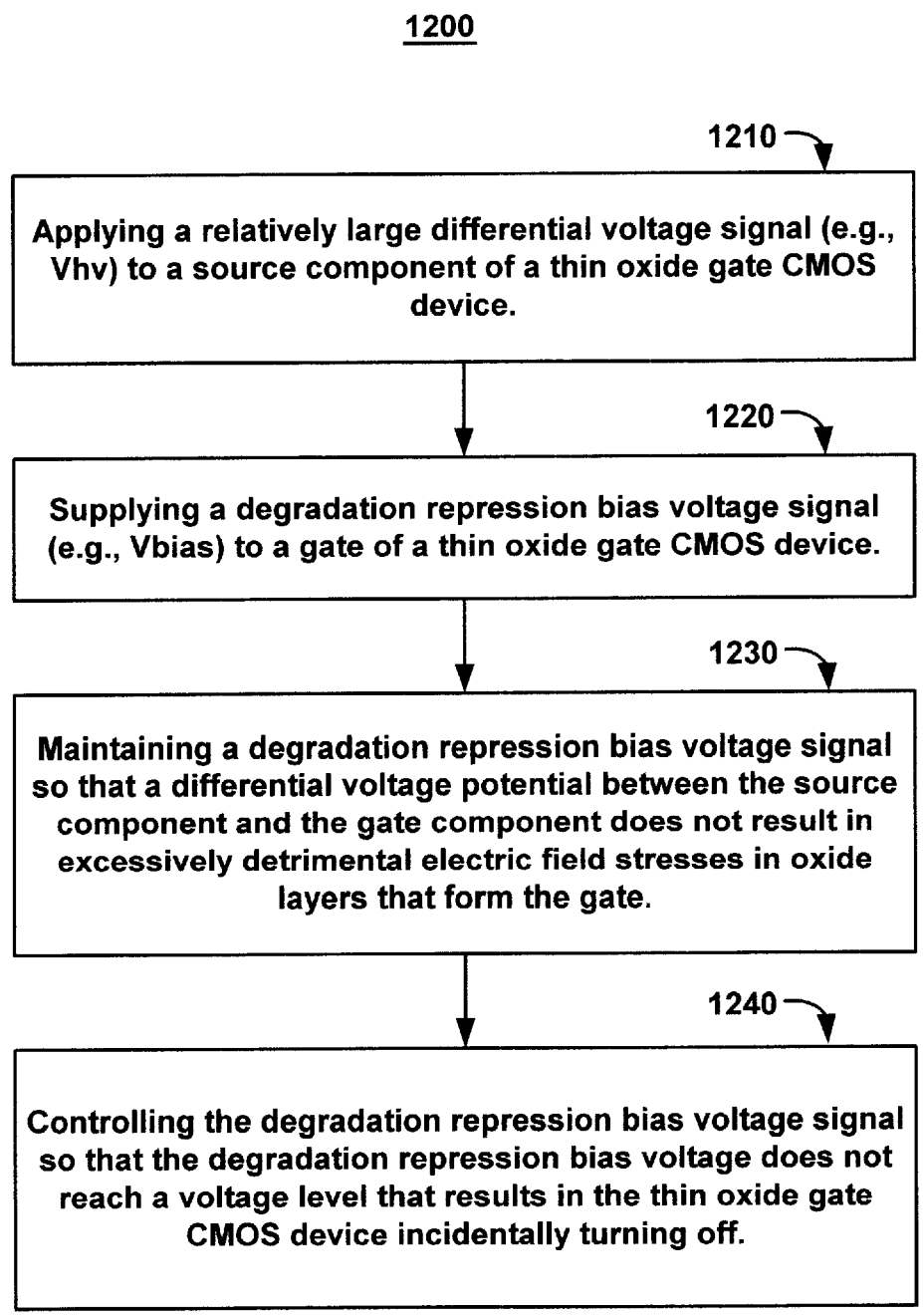
FIG. 12 is a flow chart of high voltage CMOS thin oxide gate signal driver method.

FIG. 12 is a flow chart of a large voltage differential CMOS thin oxide gate signal driver method 1200. Large voltage differential CMOS thin oxide gate signal driver method 1200 permits thin oxide layers of a CMOS gate to control signals of relatively large voltage differentials between a source and a drain. Large voltage differential CMOS thin oxide gate signal driver method 1200 prevents excessively high electric fields from building up across oxide layers forming a gate in an output CMOS device thereby reducing potential adverse impacts to the CMOS device operation or longevity.

In one embodiment of the present invention, large voltage differential CMOS thin oxide gate signal driver method 1200 is included in an input/output (I/O) buffer that receives a low voltage input digital signal which transitions between an input logic low voltage value (e.g., zero volts) to an input logic high voltage value (e.g., Vdd) and transmits an output digital signal that transitions between an output logic low voltage value (e.g., zero volts) and output logic high voltage value (e.g., Vhv). The transitions in the high voltage output signal correspond to the transitions in the low voltage input digital signal. A degradation repression bias voltage utilized in large voltage differential CMOS thin oxide gate signal driver method 1200 prevents excessive deterioration of operational ability and longevity due to electrical field stresses in a thin oxide gate output CMOS device In Step 1210 a relatively large differential voltage signal (e.g. Vhv) is applied to a source component of a thin oxide gate CMOS device. In one example, the relatively large differential voltage signal is greater than a voltage level that otherwise creates electrical fields that violate electrical stress tolerance limitations of metal oxide layers forming a gate in a thin oxide gate CMOS device. However, large voltage differential CMOS thin oxide gate signal driver method 1200 prevents the formation of excessively detrimental electric field stresses on oxide layers that form a thin oxide gate in a CMOS device.

In step 1220 a degradation repression bias voltage signal (e.g., Vbias) is supplied to a gate of the thin oxide gate CMOS device. The degradation repression bias voltage signal raises a voltage potential at a gate so that a differential voltage potential between the source component and gate component of a thin oxide gate CMOS device does not result in excessively detrimental electric field stresses in oxide layers that form the thin oxide gate. In one embodiment of the present invention the degradation repression bias voltage signal is derived from an existing source in a circuit (e.g., Vdd).

Large voltage differential CMOS thin oxide gate signal driver method 1200 maintains the degradation repression bias voltage signal in step 1230 so that a differential voltage potential between the source component and gate component of a thin oxide gate CMOS device does not result in excessively detrimental electric field stresses in oxide layers that form the thin oxide gate. In one embodiment of the present invention the degradation repression bias voltage signal is confined to a predetermined acceptable range. In one embodiment of the present invention, a limiter holds the degradation repression bias voltage signal between an upper limit voltage value (e.g., Vupper) and a lower limit voltage value (e.g., Vlower) during static states. In another embodiment of the present invention the degradation repression bias voltage signal is actively driven and tightly held at an appropriate voltage level by a level driver during signal propagations. Thus, large voltage differential CMOS thin oxide gate signal driver method 1200 is able to accommodate stronger degradation repression bias voltage signal requirements of a rising edge transition at a pad with a level driver and relatively lesser degradation repression bias voltage signal requirements of a falling edge transition at a pad with a voltage limiter.

In step 1240 the degradation repression bias voltage signal is controlled so that the degradation repression bias voltage signal does not reach a voltage level that results in said thin oxide gate CMOS device incidentally turning off. In one embodiment of the present invention large voltage differential CMOS thin oxide gate signal driver method 1200 establishes an upper limit voltage value that is low enough to prevent a the voltage potential gate from getting close enough to the voltage level of a source to cause a thin oxide gate CMOS device.

In one embodiment of large, voltage differential CMOS thin oxide gate signal driver method 1200 an output enable feature controls the enablement and disablement of a CMOS device. The output enable feature causes large voltage differential CMOS thin oxide gate signal driver method 1200 to operate in either a diode mode or off mode. In the off mode high voltage CMOS thin oxide gate signal driver method 1200 does not disable or prevent high voltage output operations. When an enable signal is high, high voltage CMOS thin oxide gate signal driver method 1200 is in diode mode and disables or prevents high voltage output operations.

In one embodiment of large voltage differential CMOS thin oxide gate signal driver method 1200 control signals are sequenced to prevent power dissipation when Vee is at zero volts and Vdd is already powered up. If Vee is zero then the signals at certain nodes coupled to certain components (e.g., a bias voltage level driver, off state component or inverter) are logically determined without inducing crowbar current in those components. One embodiment of large voltage differential CMOS thin oxide gate signal driver method 1200 includes a step of sensing when Vee is less than Vdd. When large voltage differential CMOS thin oxide gate signal driver method 1200 senses that Vee is less than Vdd, high voltage CMOS thin oxide gate signal driver method 1200 prevents current flow from Vdd to Vss.

Thus the present invention comprises an integrated circuit system and method that includes relatively thin gate oxide CMOS devices capable of transmitting electrical signals at relatively high voltage levels without an excessively detrimental electric field build up across oxide layers forming a gate in the device. The system and method of the present invention facilitates the operations of thin gate oxide devices without exacerbated longevity degradation due to excessive electrical field stresses across thin oxide gate layers. The present invention does not require additional power supplies or reference voltages and does not dissipate additional power in a static (non-switching) state.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A high voltage output CMOS thin oxide gate signal driver system comprising:
   an output CMOS device adapted to transmit a high voltage signal;
   a bias voltage range limiter coupled to said output CMOS device, said bias voltage range limiter adapted to confine a gate degradation repression bias voltage signal within a range that results in an acceptable voltage differential from a gate of said output CMOS device to a source and drain of said output CMOS device that is within electric field stress tolerance limitations of said output CMOS device;
   a pull down component coupled to said output CMOS device, said pulldown component adapted to pull a signal down;
   a bias voltage level driver coupled to said output CMOS device; said bias voltage level driver adapted to actively drive said gate degradation repression bias voltage signal to an acceptable level that results in a voltage differential from the gate of said output CMOS device to the source and drain of said output CMOS device that is within electric field stress tolerance limitations of said output CMOS device; and
   a high voltage input component coupled to said bias voltage level driver, said high voltage input component configured as an input receiver adapted to provide a feedback signal to said bias voltage level driver.

2. The high voltage CMOS thin oxide gate signal driver system of claim 1 further comprising:
   an output enable logic component coupled to said output CMOS device, said output enable logic component to operate in either a diode mode in which said output CMOS device is disabled or an off mode in which said output enable logic component does not disable said output CMOS device.

3. The high voltage CMOS thin oxide gate signal driver system of claim 1 wherein said bias voltage level driver is further adapted to tightly hold said gate degradation repression bias voltage signal at said acceptable level.

4. The high voltage CMOS thin oxide gate signal driver system of claim 1 wherein said bias voltage level driver further comprising a state component adapted to tightly hold the gate degradation repression bias voltage signal at the acceptable level during a transition.

5. The high voltage CMOS thin oxide gate signal driver system of claim 1 wherein said bias voltage range limiter further comprises:
   a voltage bias node adapted to transmit a bias voltage;
   a first diode coupled to said voltage bias node and a voltage Vdd, said first diode adapted to confine said gate degradation repression bias voltage signal above a lower voltage limit of said a range that results in a voltage differential from a gate of said output CMOS device to a source and drain of said output CMOS device that is within electric field stress tolerance limitations of said output CMOS device; and
   a second diode coupled to said voltage bias node and a voltage Vss, said second diode adapted to confine said gate degradation repression bias voltage signal below an upper voltage limit of said a range that results in a voltage differential from a gate of said output CMOS device to a source and drain of said output CMOS device that is within electric field stress tolerance limitations of said output CMOS device.

6. The high voltage CMOS thin oxide gate signal driver system of claim 1 further comprising:
   a second CMOS device adapted to transmit a high voltage signal, said second CMOS device coupled to said first CMOS device;
   an on state component coupled to said second CMOS device, said on state component adapted to drive said second CMOS device to an on state;
   an off state component coupled to said second CMOS device, said off state component adapted to turn off said second CMOS device; and
   an inverter component coupled to said off state logic component, said inverter component adapted to ensure said second CMOS device is not receiving a signal to turn on and off at the same time.

7. The high voltage CMOS thin oxide gate signal driver system of claim 6 further comprising:
   a power sequencing component coupled to said off state component, said power sequencing component adapted to sequence control signals to prevent power dissipation when Vee is at zero volts and Vdd is powered up.

8. A high voltage CMOS thin oxide gate signal driver method comprising the steps of:
   applying a relatively high voltage output signal to a source component of a thin oxide gate CMOS device;
   supplying a degradation repression bias voltage signal to a gate of said thin oxide gate CMOS device;
   maintaining said degradation repression bias voltage signal so that a differential voltage potential between said source component of said thin oxide gate CMOS device and said gate component of said thin oxide gate CMOS device does not result in excessively detrimental electric field stresses in oxide layers that form said thin oxide gate;
   controlling said degradation repression bias voltage signal so that said degradation repression bias voltage signal does not reach a voltage level that results in said thin oxide gate CMOS device incidentally turning off; and
   driving said degradation repression bias voltage signal actively and tightly holding said degradation repression bias voltage signal.

9. A high voltage CMOS thin oxide gate signal driver method of claim 8 further comprising the step of:
   confining said degradation repression bias voltage signal to a predetermined acceptable range bounded by an upper limit voltage value and a lower limit voltage value.

10. The high voltage CMOS thin oxide gate signal driver method of claim 8 whereas said relatively high voltage output signal value is large enough to produce electrical field stresses that deteriorate operational ability and longevity of the thin oxide gate output CMOS device when a degradation repression bias voltage signal is not coupled to a gate of the thin oxide gate CMOS device.

11. The high voltage CMOS thin oxide gate signal driver method of claim 8 further comprising the steps of:
   receiving a low voltage input digital signal which transitions between an input logic low voltage value to an input logic high voltage value; and
   transmitting a relatively high voltage output digital signal that transitions between an output logic low voltage value and output logic high voltage value.

12. The high voltage CMOS thin oxide gate signal driver method of claim 8 further comprising the step of sequencing control signals to prevent power dissipation when Vee is at zero volts and Vdd is already powered up, wherein said Vee is a voltage utilized to provide said relatively high voltage output signal and said Vdd is a reference point voltage utilized to derive said degradation repression bias voltage signal.

13. The high voltage CMOS thin oxide gate signal driver method of claim 12 further comprising the steps of:
   sensing when Vee is less than Vdd; and
   preventing current flow from Vdd to Vss, wherein said Vss is a different reference point voltage also utilized to derive said degradation repression bias voltage signal.

* * * * *